United States Patent
Heyl et al.

(10) Patent No.: US 8,358,788 B2
(45) Date of Patent: Jan. 22, 2013

(54) NOISE CANCELLATION FOR MICROPHONE-SPEAKER COMBINATIONS USING COMBINED SPEAKER AMPLIFIER AND REFERENCE SENSING

(75) Inventors: Lawrence F. Heyl, Colchester, VT (US); Timothy M. Johnson, San Jose, CA (US)

(73) Assignee: Apple Inc., Cupertino, CA (US)

( * ) Notice: Subject to any disclaimer, the term of this patent is extended or adjusted under 35 U.S.C. 154(b) by 796 days.

(21) Appl. No.: 12/535,516

(22) Filed: Aug. 4, 2009

(65) Prior Publication Data

US 2011/0033056 A1 Feb. 10, 2011

(51) Int. Cl.
*H04B 3/00* (2006.01)

(52) U.S. Cl. .......... 381/77; 381/123; 381/111; 381/120; 379/387.01; 379/388.05; 330/69

(58) Field of Classification Search .............. 381/58, 381/120, 71.1–71.14, 56, 57, 61, 74, 77, 381/94.1, 107, 111, 123, 370, 375, 376; 379/387.01, 379/388.05; 330/67, 69
See application file for complete search history.

(56) References Cited

U.S. PATENT DOCUMENTS

| | | | | |
|---|---|---|---|---|
| 5,033,090 A | * | 7/1991 | Weinrich | 381/318 |
| 5,172,410 A | | 12/1992 | Chace | |
| 5,208,865 A | * | 5/1993 | Friske et al. | 381/94.5 |
| 5,408,533 A | * | 4/1995 | Reiffin | 381/96 |
| 5,692,042 A | | 11/1997 | Sacca | |
| 6,016,136 A | * | 1/2000 | Fado et al. | 715/721 |
| 6,060,933 A | | 5/2000 | Jordan et al. | |
| 2007/0049103 A1 | * | 3/2007 | Kashi et al. | 439/396 |
| 2007/0273438 A1 | * | 11/2007 | Hickman et al. | 330/69 |

OTHER PUBLICATIONS

"Feature-Rich, Complete Audio Record/Playback for GSM/GPRS Cell Phones", MAXIM Integrated Products, Sunnyvale, CA, USA, Sep. 12, 2005, (8 pages).
"Op Amp Circuit Collection", AN-31, National Semiconductor, Application Note 31, Sep. 2002, (33 pages).
"Stereo Audio CODECs with Microphone, DirectDrive Headphones, Speaker Amplifiers, or Line Outputs", MAX9851/MAX9853, MAXIM Integrated Products, Sunnyvale, CA, USA, 19-3732; Rev. 2; Jul. 2007, (71 pages).

\* cited by examiner

*Primary Examiner* — Vivian Chin
*Assistant Examiner* — Paul Kim
(74) *Attorney, Agent, or Firm* — Blakely, Sokoloff, Taylor & Zafman LLP (57) ABSTRACT

An audio host device has a connector having a speaker contact, a microphone contact, and a reference contact. The reference contact is shared by a microphone and a speaker. The reference contact is also directly coupled to a power return plane of the audio host device. A difference amplifier is provided, having a first cold input, a second cold input, and hot input. The first cold input is coupled to an output of the speaker amplifier, while the second cold input is coupled a sense point for the reference contact. The hot input is coupled to the microphone contact. Other embodiments are also described and claimed.

29 Claims, 6 Drawing Sheets

NOISE CANCELLATION FOR MICROPHONE-SPEAKER COMBINATIONS USING COMBINED SPEAKER AMPLIFIER AND REFERENCE SENSING

An embodiment of the invention relates to noise cancellation techniques that improve headset-based audio communications using a portable host device. Other embodiments are also described.

BACKGROUND

For two-way, real-time audio communications, referred to here generically as voice or video telephony, a user can wear a headset that includes a single earphone (also referred to as a headphone or a speaker) and a microphone, or a pair of stereo earphones and a microphone, that are connected to a host communications device such as a smart phone. The headset, which integrates the earphones with a microphone, may be connected to the host device through a 4-conductor electrical interface typically referred to as a headset plug and jack matching pair. The four conductors are used as follows: two of them are used for the left and right earphone signals, respectively; one of them connects the microphone signal; and the last one is the reference or power return, conventionally taken as the audio circuit reference potential. The plug that is at the end of the headset cable fits into a mating 4-conductor jack that is integrated in the housing of the host device. Connections are made within the host device from the contacts of the headset jack to various audio processing electronic components of the host device.

Packaging restrictions in host devices such as a smart phone or a cellular phone create difficult challenges for routing the signal and power lines. For example, the headset jack is often located distant from the main logic board on which the audio processing components are situated, so that the headset signal needs to be routed through a flexible circuit and one or more board-to-board connectors. The multiple connections increase the impedance of the connection, as well as the manner in which the connections are made namely through narrow or thin metal circuit board traces, and can lead to the coupling of audio band noise during operation of the host device. In addition, with the shared nature of the headset's reference or ground contact (shared by the microphone and the earphones of the headset), further noise is produced at the output of the microphone preamplifier. The preamplifier provides an initial boost to the relatively small microphone signal that is received from the headset. The practical effect of such audio noise at the output of the microphone preamplifier is often that the listener at the far end of a telephone conversation hears an echo of her own voice, with a concomitant reduction in the quality of the sound.

Attempts to reduce (or, as generically referred to here, "cancel") the noise at the output of the microphone preamplifier have been made. In one case, the concept of differentially sensing the microphone signal is used. For this purpose, a differential amplifier (in contrast with a single-ended amplifier) is used to amplify only the difference between the voltage at a sense point for the headset ground contact and the voltage at a sense point for the microphone signal contact. Using such a configuration, any audio voltage that may appear as noise between a local ground (local to the microphone preamplifier) and the ground that is near the headset jack or socket are largely rejected (that is, not significantly amplified), while the audio signal on the microphone signal contact is amplified.

SUMMARY

Packaging constraints and compromises of the microphone and earphone signals and their common return in the host device leads to a common mode imbalance that can cause undesired common mode noise to be coupled into either a microphone signal loop or a speaker signal loop. In practice the microphone signal loop is more prone to contamination by offensive audio band noise. In addition, compromised routing of the audio signals represents a finite impedance that can act as a victim impedance for near-by sources of noise within the host device, whether of low frequency similar to the audio base bandwidth, frequencies subject to heterodyning or fold over by sampled data converters, or non-linear impedances capable of demodulating local radio frequency energy.

The differential sensing approach described above in the Background section for ameliorating microphone preamp noise falls short when the following practical considerations are taken into account. First, there are several different types of headsets in the marketplace, each of which may have a different type of microphone circuit. Second, there are manufacturing variations in the microphone circuit, even for the same make and model of headset. Finally, manufacturing as well as temperature variations can affect the electrical characteristics of a flexible circuit or board-to-board connector that is used to connect with the headset interface within the host device. Any successful attempt to cancel the microphone noise by differentially sensing the microphone signal will require knowledge of the precise electrical characteristics of the relevant circuitry, in each instance of the manufactured host device and headset combination. This however is not a practical solution.

An embodiment of the invention is an improved circuit for reducing microphone amplifier noise in a two-way audio communications host device. The circuit provides a more robust solution in that it is able to perform good noise reduction for different types or brands of headsets whose microphone circuits have different impedances. It can also compensate for parasitic effects in the host device that may have been caused by compromised signal or ground routing between the host headset connector and the microphone amplifier.

An audio host device in accordance with an embodiment of the invention has the following elements. A host connector has a speaker contact, a microphone contact, and a reference contact. The reference contact is to be shared by a connected microphone and speaker. The reference contact is directly coupled to a power return plane of the audio host device. There is also a speaker amplifier having an output that is coupled to the speaker contact.

A microphone preamplifier (or, simply, amplifier) is implemented using a difference amplifier having a first cold input, a second cold input, and a hot input. The first cold input is coupled to an output of the speaker amplifier. The second cold input is coupled to a sense point for the reference contact. The hot input is coupled to the microphone contact. A proportion of one or both of the sensed speaker amplifier output and the sensed reference, that have been combined at a cold side input of the difference amplifier, is adjusted so as to yield reduced noise at the output of the microphone preamplifier.

In one embodiment, the microphone preamplifier includes first and second variable gain component amplifiers. The first component amplifier conditions a signal from the output of the speaker amplifier, while the second component amplifier has an input coupled to the reference sense point. A controller is coupled to the first and second component amplifiers. The controller sets the gain of the first and second component amplifiers in order to reduce or minimize noise at the output of the difference amplifier.

In one embodiment, the controller acts in an open loop fashion by setting the gain depending upon the predetermined type of microphone-speaker combination to which the host device is to be, or is now, connected. The determination may be detected automatically or it may be obtained via direct user input. For example, the determination may be a look up performed on a previously stored table that lists different types of microphone circuits and their respective gain settings that have been shown to yield improved or optimal noise cancellation. Configured in this manner, the difference amplifier will produce the boosted microphone signal with improved signal to noise ratio. The configuration process may be performed "in the field", i.e. while the host device is used in its normal course by the end user.

In another embodiment, the controller acts in a closed loop fashion when setting the gain. In that case, the controller has an input coupled to an output of the difference amplifier. The controller measures the output of the difference amplifier and on that basis adjusts the gain until the presence of a constant power test signal at the output of the difference amplifier is sufficiently minimized, or essentially removed. In another embodiment, instead of a dedicated, constant test signal, the excitation may be the inherent speech in the downlink communications signal. This closed loop control process may be done in the field, and in a manner that is generally inconspicuous to the end user.

In one embodiment, the test signal is a constant power super-audible tone that is generated and played through a speaker contact of the microphone-speaker combination connector in the host device, while a microphone-speaker combination is connected. The output of the microphone signal difference amplifier is measured, while the microphone-speaker combination is connected and the super-audible tone is playing. The gain of one or both of the component amplifiers is set, based on the measurement, in a manner that reduces the presence of the super-audible tone at the output of the difference amplifier. A final gain setting is selected, which may be the one for which the presence of the super-audible tone is reduced to below a given threshold or has been minimized. In that setting, the microphone amplifier is deemed calibrated, so that an uplink audio communications signal from the output of the amplifier can be transmitted, e.g. during a telephone call, with improved signal to noise ratio and reduced far end echo.

In another embodiment, the test signal is any signal applied to the speaker outputs and detected in the signal recovered from the microphone amplifier. The test signal may therefore be constrained along fairly broad lines, examples being individual tones or combinations of tones spread above, below, and in special cases through the audio band used in the product. The significant constraint on choice of the test signal is that it not be distracting to the user. In consequence, because the application of the test signal is not necessarily continuous, its spectral characteristics can be designed to fulfill other system requirements.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
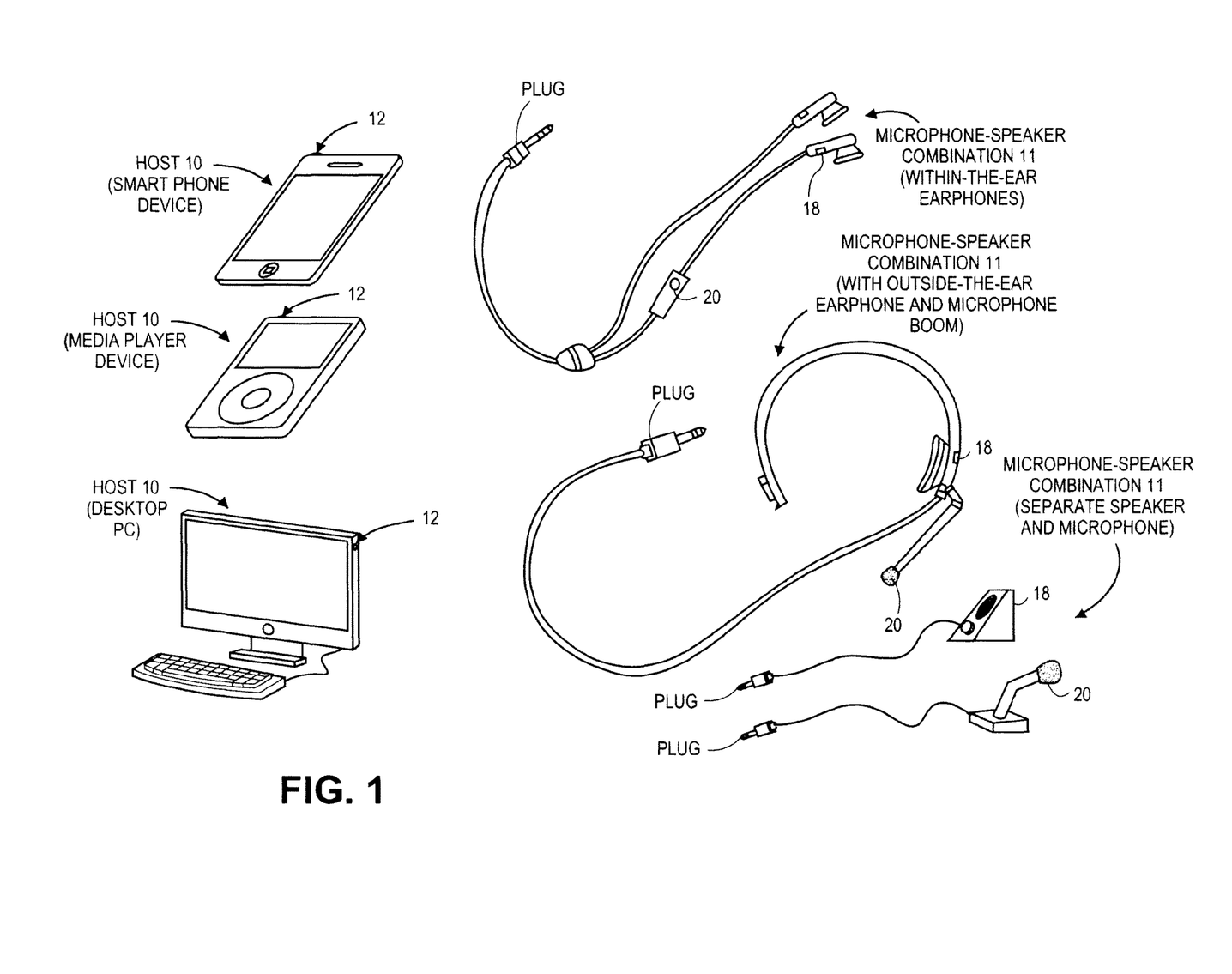
FIG. 1 shows several different combinations of host devices and microphone-speaker combinations in which one or more embodiments of the invention can appear.

FIG. 1 shows several types of host devices 10 and microphone-speaker combinations 11 in which various embodiments of the invention can be implemented. In particular, a noise reduction (here generally referred to as noise cancellation) mechanism may be integrated entirely within the housing of the host device 10. The host 10 may be a smart phone device, a media player device, or a desktop or portable personal computer. The host 10 has a microphone-speaker combination electrical interface 12, which is generically referred to here as a "headset" electrical interface 12, only for convenience. The headset electrical interface 12 may include what is typically referred to as a jack or connector that is integrated into the host housing. Although not shown, the host 10 also includes conventional audio processing components that enable a two-way real time audio communications session or conversation (e.g. voice or video telephony) between a near end user of the host 10 and a far end user. The conversation may be conducted in a cellular network telephone call, a plain old telephone system or analog call, or an Internet telephony call, or other duplex voice channel, e.g. a conference call convened by any of the above media or a multimedia application requiring simultaneous voice input and output from two or more users (one or more of which may actually be a synthetic speech recognition and synthesis system.)

The host 10 may be coupled to one or more microphone-speaker combinations 11, through its headset electrical interface 12. Several different types of microphone-speaker combinations 11 that can be used are shown, including two different types of headsets (one in which a pair of earphones or headphones are in loose form, and another where a single earphone is attached to a microphone boom) and a combination microphone stand and desktop loudspeaker. Each of these microphone-speaker combinations 11 can be a separate item than the host device 10, and can be coupled to the host device 10 through a cable connector that mates with the headset electrical interface 12 in the housing of the host device 10.

Figure 2A:
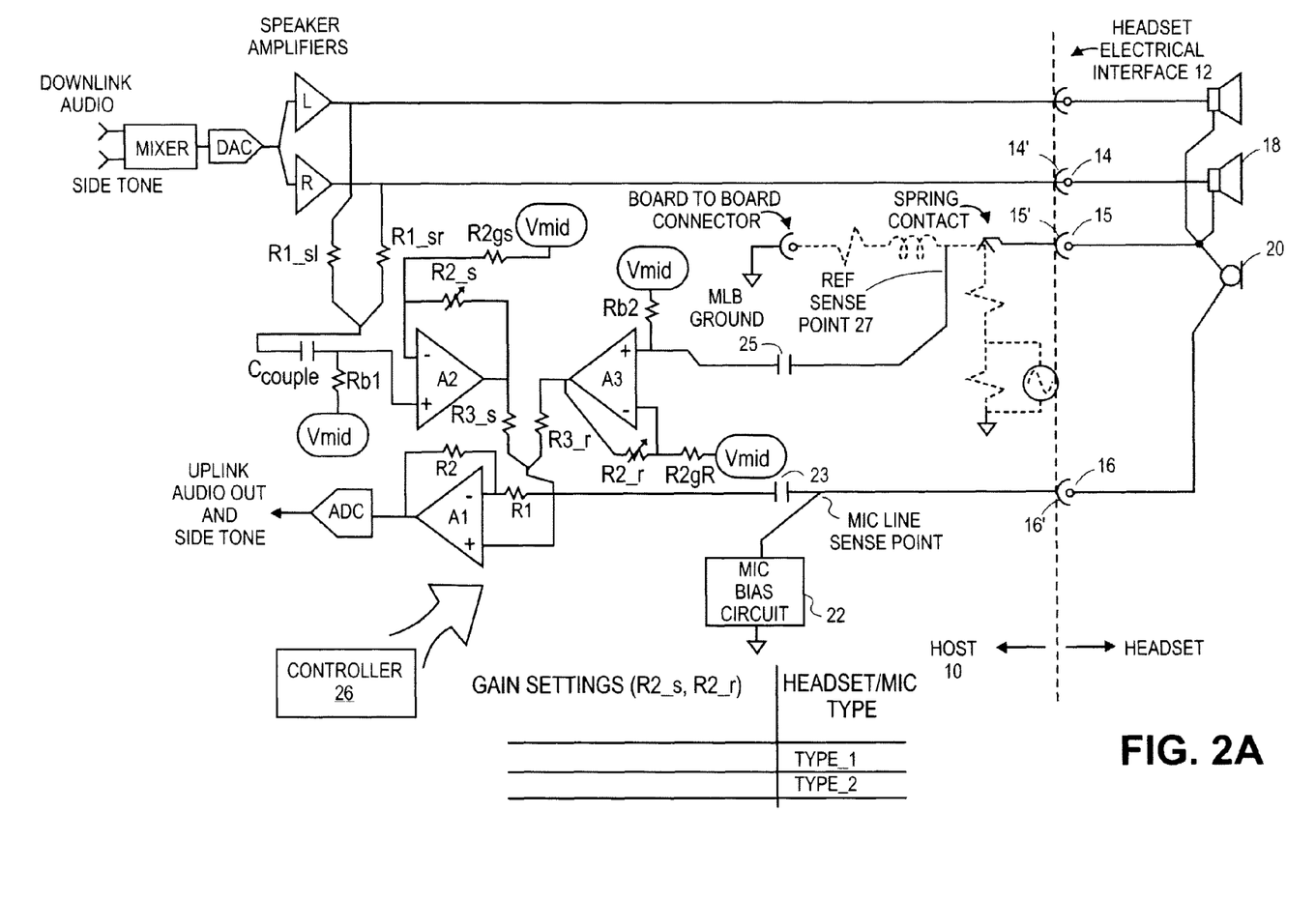
FIG. 2A is a circuit diagram of an embodiment of the invention.

Referring now to FIG. 2A, a circuit schematic of an embodiment of the invention is shown. In this embodiment, each speaker 18 (only one speaker is directly labeled 18) has a power return terminal that is connected to a shared reference or ground contact 15, the latter being located in a cable connector (e.g. a plug.) The reference contact 15 in the plug mates with a corresponding reference contact 15' of a host-side connector (e.g. a jack) integrated in the host 10. A pair of speaker contacts 14 (only one shown) that make a direct connection with their respective contacts 14' of the host connector and the microphone-speaker combination 11 also includes a microphone circuit 20 that shares the reference contact 15 with the speakers 18. The microphone circuit 20 also has a signal output terminal that is connected to its separate microphone contact 16 which mates with a corresponding microphone contact 16' of the host-side connector in the host 10. This microphone-speaker combination 11 may be a conventional headset in which the microphone circuit 20 and the speaker 18 are integrated.

In a typical case, all four of the contacts shown in FIG. 2A for the headset electrical interface 12 are integrated in the same connector (e.g., a 4-conductor headset jack in the host 10, and a mating headset plug.) Note that although the example here is a headset electrical interface 12 that has four contacts, the concepts of the invention are also applicable to a mono system that requires only three contacts, that is a single speaker contact 18, a shared reference contact 15, and a single microphone contact 16. There may be additional contacts integrated in the headset electrical interface 12 that are not relevant here.

In some cases, there may be multiple microphones in the microphone-speaker combination 11 that share the same reference contact 15', e.g. a headset with an integrated microphone array that can be used to implement an audio beamforming function by the host device 10. For that scenario, the headset electrical interface 12 could have more than one microphone contact 16', one for each of the microphones of the array.

Figure 2B:
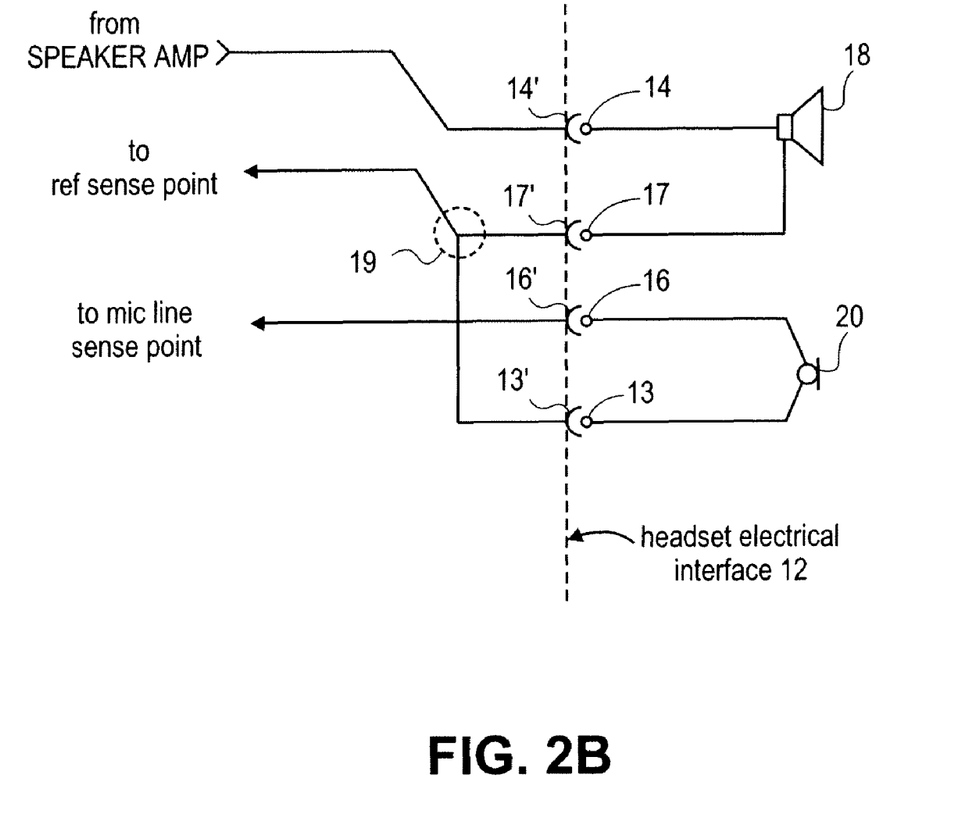
FIG. 2B is a circuit diagram of another possible arrangement for the shared reference contact in the host device.

Note that in FIG. 2A, the reference contact 15' in the host device 10 is a node that is shared, by the return terminals of the speaker 18 and microphone circuit 20. In this case, the return terminals are electrically joined or directly connected to each other outside the host device 10. An alternative to this scheme is where separate connectors are used for the speaker 18 and the microphone circuit 20, e.g. a microphone stand and a separate desktop speaker as shown in FIG. 1. The circuit schematic of this embodiment is shown in FIG. 2B. Here, the return terminals of the speaker and microphone are electrically joined inside the host device 10. The speaker and microphone connectors have separate ground contacts 17, 18, and inside the host device 10 the reference contact 15' is joined to the host side contacts 17', 18' as shown. The invention here may also be particularly applicable if the reference contact 15' were constrained by system requirements to have significant impedance such that the return current of the speaker 18 could develop a significant voltage across the impedance between the reference contact 15' and the audio system reference potential (MLB ground.)

With the microphone-speaker combination 11 connected to the host device 10, a user of the host device can hear the far end user talking during a telephone call and can speak to the far end user at the same time, by way of the speakers 18 and microphone circuit 20, respectively. The voice of the far end user originates in a downlink audio signal that arrives in the host 10 over a communications network. The downlink signal may be in digital form when it passes through several stages that may include various digital signal processing operations, including a mixer that allows the addition of sidetone. The downlink signal with the sidetone is then converted into analog form using a digital to analog converter (DAC), before being applied to the headset electrical interface 12 by a speaker amplifier. At the same time, the near end user may speak into the microphone circuit 20, which picks up the voice as an uplink audio signal that passes through the headset interface 12 (in particular the microphone contacts 16, 16'.) The uplink audio signal is then boosted by a microphone preamplifier and may then be converted into digital form by an analog to digital converter (ADC.) This allows the generation of a digital sidetone signal which is returned to the speaker 18 as explained above. In addition, the uplink audio signal may be subjected to further digital signal processing before being transmitted to the far end user's host device over the communications network.

Specifics of the noise cancellation circuitry in the host 10 are now described. Still referring to FIG. 2A, the reference contact 15' is routed and directly connected to a circuit board layer that is at the ground or reference voltage. This may be the reference relative to which a power supply voltage Vcc is measured, which powers the various electrical circuit components of the host 10, including audio processing components such as the microphone amplifier. The power return plane is also referred to here as the main logic board (MLB) ground.

Due to practical limitations, the electrical connection or direct coupling between the reference contact 15' and the MLB ground that is at the microphone amplifier is not identically zero ohms, particularly in the audio frequency range. This may be due to various physical structures that create parasitic or stray effects, represented in FIG. 2A by virtual resistors, capacitors and inductors (shown in dotted lines.) For the audio frequency range, the primary parasitic or stray components of concern may be series resistors, inductors, and an equivalent noise voltage source, all of which are depicted by dotted lines. The practical limitations that cause the parasitic effects may include spring contacts and board-to-board connectors, including those that are part of a flexible wire circuit that may be needed due to packaging constraints within the housing of the host device 10. As to the audio noise source shown, this may be primarily due to the reference contact 15 being shared by both the microphone circuit 20 and one or more speakers 18.

There are different types of microphone-speaker combinations 11 that can be used with the same host connector, each of which may have a different type of microphone circuit 20. For example, there are passive microphone circuits that are essentially passive acoustic transducers that produce an analog transducer signal on the microphone contact 16. There are also non-passive or active microphone circuits 20 that drive a modulated signal on the microphone contact 16. In both cases, a dc microphone bias circuit 22 may be needed in the host device 10, coupled to the microphone contact 16' as shown, to provide a dc bias voltage for operation of the microphone circuit 20.

An attempt to cancel or reduce microphone-speaker combination noise, which appears in the uplink audio communications signal and may manifest itself when the far end user hears an echo of his own voice during a telephone call, calls for differentially sensing the microphone signal. As explained above in the Summary section, however, such a technique should be performed carefully else the noise reduction attempt will be ineffective. The different types of microphone circuits 20 present different impedances (both at dc and in the audio range) on the microphone contact 16'. Moreover, there are manufacturing variations in the microphone circuits 20, even for the same make and model of microphone-speaker combination. Thus, knowledge of the precise impedance characteristics of the microphone circuit 20, in addition to a good estimate of the parasitic components that cause a substantial difference between a signal at the output terminal of the microphone circuit 20 and what should be the same signal at the input terminal of the microphone amplifier in the host device 10, are needed. Such detailed knowledge however is not available to a single entity at the time of manufacture of the host 10 and the microphone-speaker combination 11, because a purchaser of the host device 10 may elect to use any one of a large variety of different types or brands of microphone-speaker combinations including some that may not be available during the time the audio processing functions of the host device 10 are being designed.

Still referring to FIG. 2A, a noise reduction scheme that is more robust, i.e., it will work to provide improved signal to noise ratio and/or reduced far end user echo with several different types of microphone-speaker combinations 11, is now described. In one embodiment, the microphone preamplifier is implemented using the combination of an operational amplifier (op amp) A1 configured as a difference amplifier, and op amps A2 and A3 configured as first and second variable gain component amplifiers, respectively. The first component amplifier A2 in effect senses the output of the speaker amplifiers, while the second A3 senses the reference contact. These sensed signals are then combined at the cold side input of the difference amplifier A1. In one embodiment, the difference amplifier then applies a voltage gain, to the difference between a) a combination of the signals taken from the speaker amplifier output A2 and the reference sense point amplifier A3, and b) a signal from the microphone sense point 16'. Changing the respective gains of the component amplifiers will result in adjusting the proportions of the sensed signals as they are combined in order to reduce noise at the output of the difference amplifier. In addition, the common mode gain of the difference amplifier (A1) may be adjusted to help further reduce the noise at the output of the difference amplifier. A particular circuit implementation of such a concept is now described.

The difference amplifier (at A1) has first and second cold inputs at the resistors R3_s and R3_r, and a hot input at R1. The references to cold and hot are merely for ease of understanding, simply to denote complementary inputs, and should not otherwise be interpreted as limiting. In this case, the cold inputs are associated with a cold side input which is the non-inverting (+) input of A1, while the hot side input is at the inverting (−) input of A1. The cold side (+) input is also dc biased to Vmid (which is typically halfway between the power supply voltage Vcc and ground of the op amp). The difference amplifier may be designed to apply a principal gain to differences between the input signals (at its cold and hot inputs), while at the same time rejecting the common mode components of the input signals. The latter is referred to as the common mode rejection (CMR) capability of the difference amplifier. The principal gain is set by the resistance ratio R2/R1, or it may be variable, by specifying R2 to be variable (e.g. a digitally controlled vernier circuit.)

In one embodiment, the CMR of the difference amplifier is adjustable, by specifying a variable voltage divider that is coupled between the two sources A2 and A3 of signals to be suppressed and the non-inverting input of op amp A1. In other words, one or both of R3_s and R3_r would be variable in that case, e.g. as a digitally controlled vernier circuit. The op amp A1 so configured may thus have several "CMR adjustment states or settings" that, as a whole, are designed to provide enough granularity and range for reducing noise at the output of the difference amplifier.

The hot input (at R1) of the difference amplifier may be RC coupled to a sense point for the microphone contact 16', i.e. through a DC blocking capacitor 23. The capacitor 23 may be coupled as shown, where one side is at the microphone sense point, which is connected to the microphone bias circuit 22, and the other is at the hot input.

The first cold input (at R3_s) of the difference amplifier is coupled to an output of the first variable operational amplifier (A2). The output for A2 is set by, $$\left( L\left( \frac{R_{b1}}{R_{b1} + R_{1\_sl}} \right) + R\left( \frac{R_{b1}}{R_{b1} + R_{1\_sr}} \right) \right)\left( \frac{R_{2\_s} + R_{2gs}}{R_{2gs}} \right)$$

if Rb2<<R1_sl, R1_sr. Note that L refers to the gain of the left speaker amplifier, and R refers to the gain of the right speaker amplifier. If there were a single speaker (R1_sl and R1_sr would become simply R1), then the gain for A2 would be simply $$\left( \frac{R_{b1}}{R_{b1} + R_1} \right)\left( \frac{R_{2\_s} + R_{2gs}}{R_{2gs}} \right).$$

In this case, the parallel combination shown for R1_sl and R1_sr is made based on the assumption that the L and R gains are the same, which may not be the case in all instances. A DC blocking capacitor Ccouple may be placed in series between the (+) input of A2 and the junction of R1_sl and R1_sr, to ensure a fixed DC bias point.

The second cold input (at R3_r) of the difference amplifier is coupled to a sense point for the reference contact 15', through the second variable operational amplifier (A3). The gain for A3 is set by the ratio (R2_r+R2gR)/R2gR. The input of the op amp A3 is RC coupled to the reference sense point, i.e. though a DC blocking capacitor 25.

The op amps A2 and A3 can be configured into any one of several gain states. As a whole, these are designed to provide enough granularity and range for reducing noise at the output of the difference amplifier, for as many different types of microphone-speaker combinations 11 as expected to be practical. The range and granularity of the gain states may be determined empirically, during testing or development of the host device 10, to be that which will provide best noise reduction for all of the different, expected microphone-speaker combinations.

Note that in other embodiments, the coupling between the inputs of the difference amplifier and the microphone and reference sense points may be different, while still having constant gain through the normal and common mode bands of interest. For example, substantially similar performance may be obtained by omitting A2 and A3, and adding a network of suitably chosen resistors to connect nodes 14' and 27 to A1+. However, in that case the gain terms interact, whereas the design with A2 and A3 is likely to perform better as A2 and A3 allow the various gain terms to be decoupled. In addition, while the dc blocking capacitor 23 is shown as being located in front of the resistor R1, an alternative is to reverse the order such that R1 is in front.

The gain settings of the component amplifiers (A2 and A3) and the CMR settings of the difference amplifier (A1) may be adjusted so as to reduce noise at the output of the difference amplifier. For this purpose, an embodiment of the invention has a controller 26 that acts in an open loop fashion when setting the gain and/or CMR states. A particular combination of states is selected depending upon the type of microphone-speaker combination to which the host device 10 is to be, or is now, connected. The type of microphone may be detected automatically or it may be obtained via direct user input. Configured in this manner, the difference amplifier will output essentially the boosted microphone signal, i.e., while at the same time rejecting noise in the form of a substantial amount of the downlink signal. The configuration process may be performed "in the field", i.e. while the host device is used in its normal course by the end user. The output of the microphone preamplifier may then be written, considering all of the circuit elements, as $$V_{out,A1} = \left[ (V_{27} + V_{14'})G_{A2}\left(\frac{R_{3\_r}}{R_{3\_r} + R_{3\_s}}\right) + V_{27}G_{A3}\left(\frac{R_{3\_s}}{R_{3\_s} + R_{3\_r}}\right) \right] - V_{16'}\frac{R_2}{R_1},$$

where $G_{A2}$ and $G_{A3}$ are the gains of their respective amplifier stages, $V_{27}$ is the voltage at the reference sense point 27, $V_{14'}$ is the voltage at node 14' (speaker amplifier output), and $V_{16'}$ is the voltage at node 16' (or at the microphone line sense point.)

In one embodiment, the controller 26 automatically detects the type of microphone-speaker combination 11 that is coupled to the host connector (headset electrical interface 12) and then accesses a previously stored look up table to determine the appropriate combination of A2 and A3 gain setting and CMR setting, for the given type of microphone-speaker combination. This may be done by using a circuit (not shown) that measures the impedance seen from the host device 10 out through the microphone contact 16', for example relative to the reference contact 15'. Different types of microphones can be expected to have different impedances; the entries of the look up table could be empirically determined and filled in advance, to include the different types of microphone by referencing their respective impedances. Other ways of automatically detecting the microphone-speaker combination type are possible, e.g. by reading a stored digital or analog code value through the speaker contact 14' or the microphone contact 16'.

In another embodiment, the controller 26 can be operated "manually", with direct user input. In that case, the controller 26 can obtain the desired combination of A2 and A3 gain setting and CMR setting, based on receiving user input regarding microphone-speaker combination type (e.g. the user could indicate his selection from a stored list of microphone-speaker combination types that are being displayed to him on a display screen of the host device 10.)

The controller 26 may be implemented as a programmed processor (e.g. an applications processor in a smart phone that is executing software or firmware) designed to manage the overall process of configuring a microphone preamplifier, for improved noise reduction.

Figure 3:
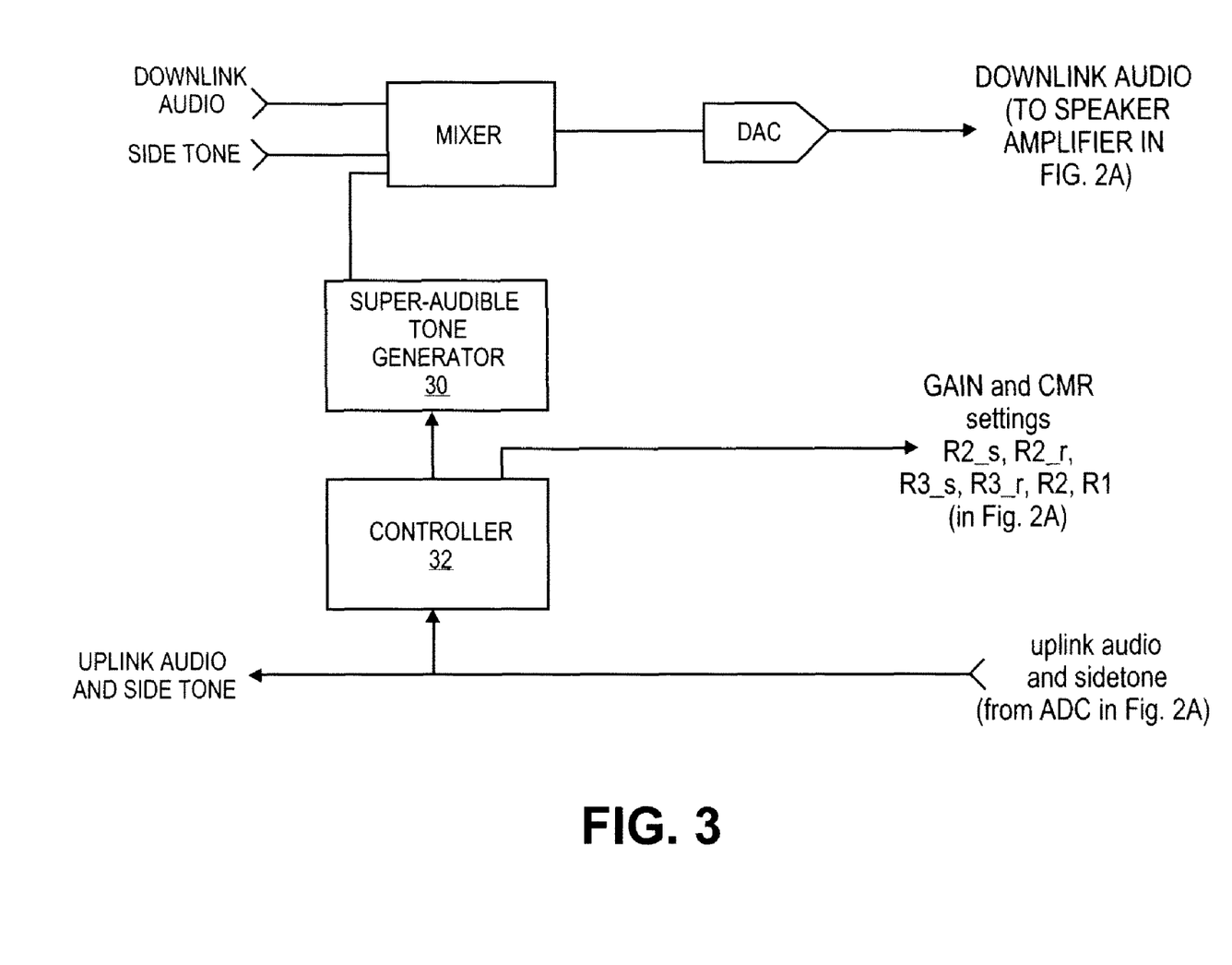
FIG. 3 is a circuit diagram of an embodiment of the invention with a closed loop controller.

Referring now to FIG. 3 in combination with FIG. 2A, a circuit diagram of an embodiment of the invention with a closed loop controller is shown. A controller 32 is provided, having an input coupled to an output of the difference amplifier (through, in this example, the ADC). An output of the controller 32 is coupled to set any one of the different component amplifier gain and difference amplifier CMR states, so as to adjust and optimize the CMR (not the principal gain) of the difference amplifier. Thus, while the difference amplifier (at A1) may have a fixed, principal voltage gain (e.g., set at the time the host device 10 is manufactured), its CMR and the gain of the component amplifiers (at A2, A3) can be adjusted by action of the controller 32, during field use of the host device 10 by the end user. This adjustment process is designed to reduce and minimize the microphone-speaker combination noise at the output of the difference amplifier.

In one embodiment, the controller 32 may be designed to have access to a previously stored indication of what is an acceptably low level of microphone-speaker combination noise at the output of the difference amplifier. In other words, values representing the lowest acceptable level of microphone-speaker combination noise, also referred to as a noise threshold, may be stored in memory or other storage within the portable device 10 that is accessible to the controller 32. This allows the controller 32 to adjust for example R2_s, R2_r, R3_s, and R3_r, while monitoring the output of the difference amplifier, until the expected noise threshold is detected.

Alternatively, the controller 32 may be designed to adjust the component amplifier and/or the CMR settings until it detects a minimum at the output of the difference amplifier, where the lowest point of the minimum represents the lowest possible noise level. In one embodiment, still referring to FIG. 3, a super-audible tone generator 30 is included, having an output coupled to the speaker contact 14'. In that case, the controller 32 may be designed to signal the generator 32 to generate a super-audible tone that is played through the speaker contact 14'. This may be viewed as a calibration or test signal. The test signal may be played for a relatively short period of time, e.g. a few seconds, while the combination gain and/or CMR states are automatically swept over a range that is sufficiently broad as to produce the expected minimum at the monitored output of the difference amplifier. The state that yields the minimum is accepted as the final setting that provides improved or optimized CMR for the current microphone-speaker combination that is being used with the host device 10. Note that by virtue of being super-audible, the test signal even though driving the connected speaker 18 cannot be heard by the end user of the host device 10, and is close enough to the audible spectrum to be useful in the noise cancellation control process.

It should be noted that it is possible for the controller 32 to perform its calibration process relying upon, as the excitation which appears at the output of the speaker amplifier, only the speech in the downlink communications audio signal, rather than a dedicated, constant power test signal introduced by the host device 10. An echo of the excitation can be estimated or measured, by computing the autocorrelation of the A1 output. The op amp gains would then be adjusted to obtain the non-trivial minimum of the measured echo. While this technique could work while relying only upon a speech signal as the excitation, the speech signal may exhibit rapid changes so as to make such a scheme difficult to implement. In that case, introducing a dedicated, constant power test signal (e.g. a super audible tone) as the excitation would likely present an easier solution.

In another embodiment of the invention, in addition to being able to vary the component amplifier gains and CMR settings, the principal gain of the difference amplifier is also programmable. A principal gain adjustment capability may be added to the controller 32, e.g. that allows the controller 32 to set the resistance ratio R2/R1 for op amp A1 in FIG. 2A through a vernier circuit. Such a vernier adjustment will need a compensatory adjustment of R3_s and R3_r for the voltage applied to A1(+) to maintain the desired common mode rejection.

Figure 4:
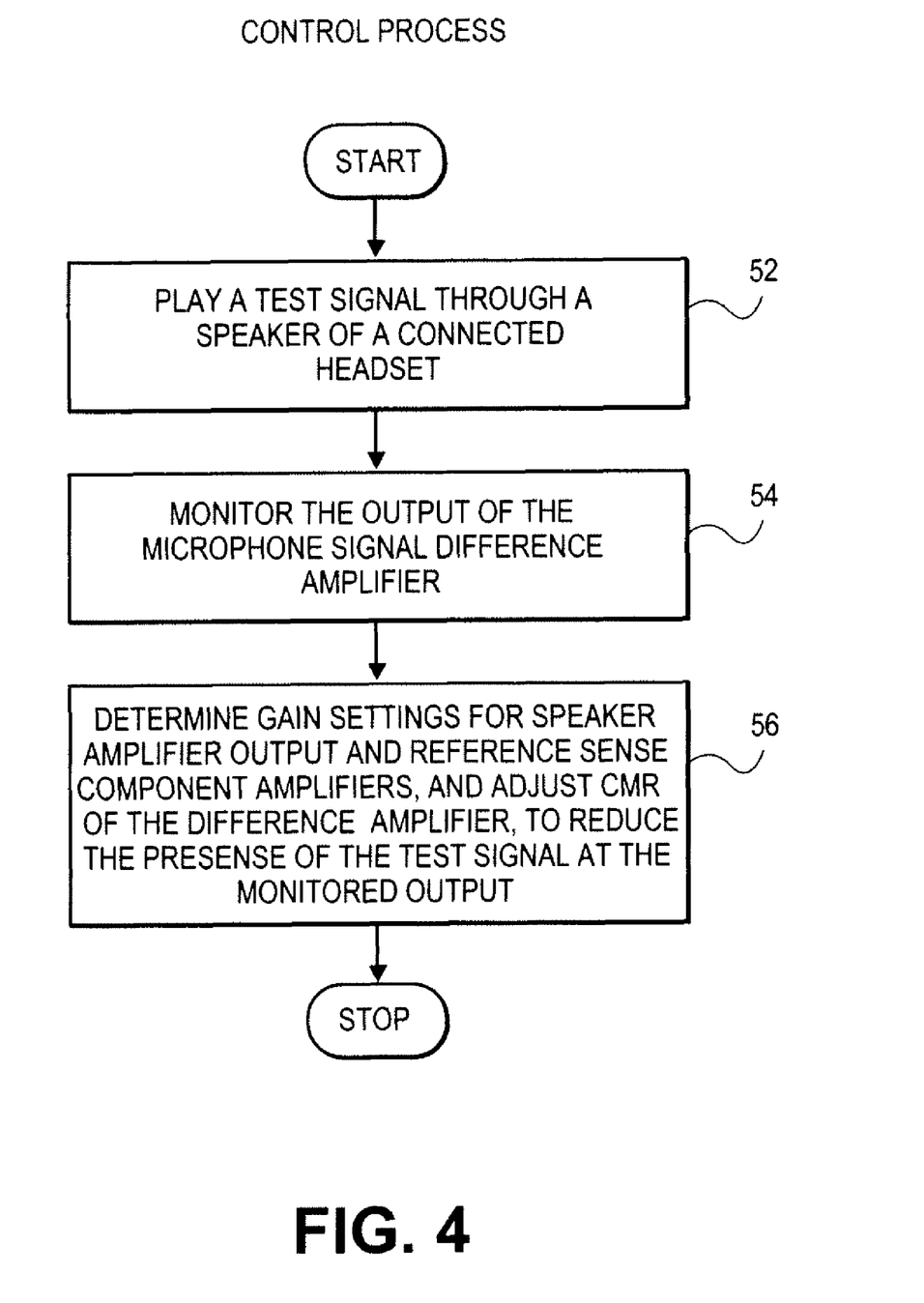
FIG. 4 is a flow diagram of a control process for configuring a microphone signal difference amplifier.

FIG. 4 is a flow diagram of a control process for operating the audio host device 10, and in particular configuring a microphone preamplifier block to yield improved differential mode noise cancellation. Note that unless specified, the sequence of operations shown is not fixed, as it is possible that a given operation could in some cases be performed either ahead or after others. In one embodiment of the invention, the microphone preamplifier control process begins with playing a test signal, e.g., a super-audible tone, through a speaker contact of a headset connector in the audio host device 10, while a headset having an integrated microphone is connected (operation 52). While the headset is connected and the super-audible tone is being played, the output of a difference amplifier is measured or monitored (operation 54). One or more of the above described settings for component amplifier gain and difference amplifier CMR is found that reduces the amplitude of the super-audible tone at the monitored output (operation 56). This may be done by sweeping one or more of the settings, while measuring the output of the difference amplifier, until a minimum of the test signal is detected at the output (representing the setting that yields the lowest amount of noise); the combination setting closest to the minimum may then be selected as the final setting. Alternatively, the final setting may be the one for which the amplitude of the super-audible tone at the output of the amplifier is reduced to below a given threshold.

If the difference amplifier also has variable gain, then the above described control process may be performed either before or after having set the gain.

Figure 5:
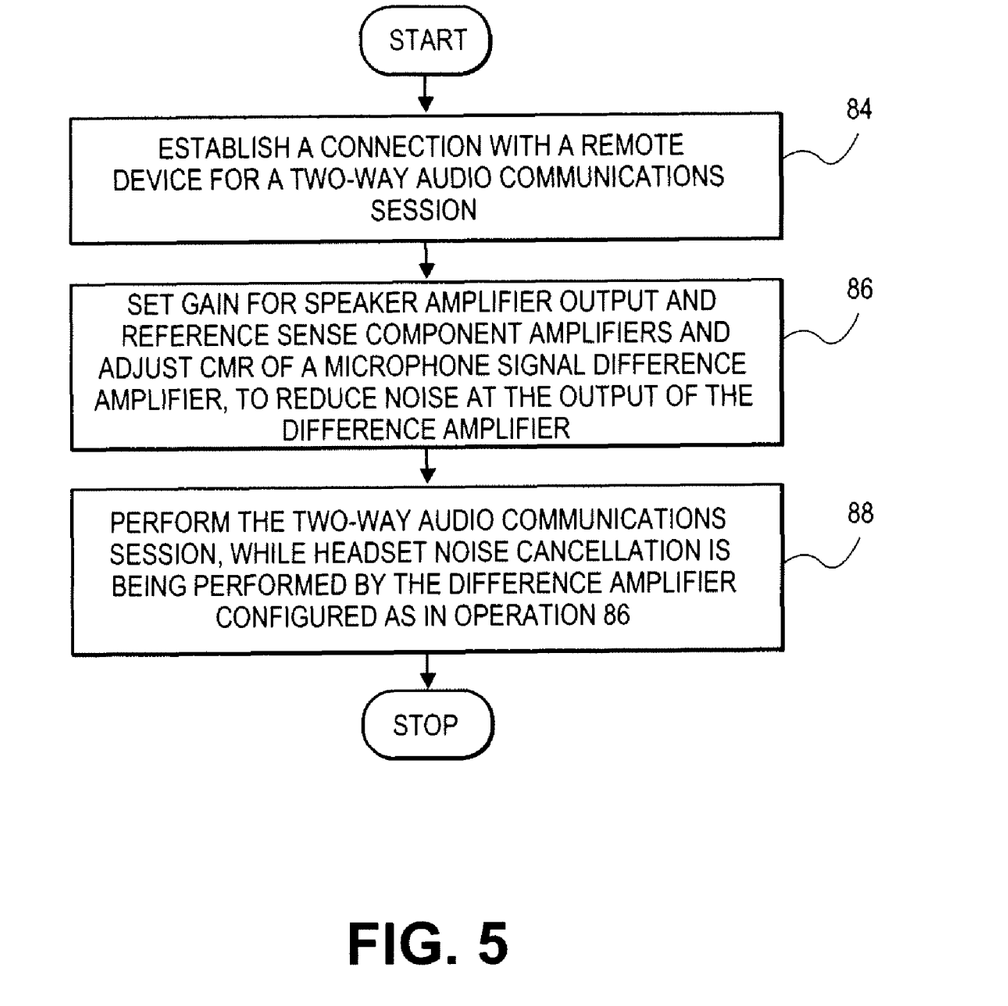
FIG. 5 is a flow diagram of a process for conducting a telephone call with the host device, in accordance with an embodiment of the invention.

FIG. 5 is a flow diagram of a process for conducting a telephone call with the host device 10, in accordance with an embodiment of the invention. Note that the sequence of operations shown is not fixed; a given operation may in some cases be performed either ahead or after the others. Beginning with operation 84, the host device 10 establishes a connection with a remote host for a two-way audio communication session (also referred to here as a voice or video telephone call.) This may be done by responding to an incoming call signal from the remote host, or initiating a call to the remote host.

In operation 86, the host device 10 configures a microphone preamplifier block to reduce noise at its output. This occurs by setting the gain of the component amplifiers and/or the CMR of the difference amplifier that make up the preamplifier block, in accordance with any one of the techniques described above. These may include: open loop manual, which is based on direct input from the near end user regarding the type of speaker-microphone combination (e.g., headset type) that is to be used with the host; open loop automatic, based on automatic measurement of microphone-speaker combination impedance or automatic detection of a microphone-speaker identification code; and closed loop, based on monitoring the output of the difference amplifier while sweeping the component amplifiers' gain and/or the difference amplifier's CMR. The output of the difference amplifier provides the improved, uplink audio communications signal for the telephone call.

In operation 88, the telephone call is performed with the benefit of noise cancellation being obtained from the difference amplifier as configured in operation 86. Thus, the far end user of the call should be able to better hear the near end user (through the uplink signal originating at the output of the difference amplifier), with higher signal to noise ratio and/or diminished echo of his own voice.

It should be noted that the selection in operation 86 could occur either before the call is established in operation 84, or it could occur during the call (e.g., as soon as the conversation begins—during operation 88).

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the host device is described in several instances as being a portable device, the noise reduction circuitry could also be useful in certain non-portable host devices such as desktop personal computers that also have similar limitations regarding interior signal routing and a shared reference contact in the headset electrical interface. Also, the concept need not be limited to the described combination of one microphone and one or two speakers. The technique disclosed can be used without loss of generality or performance to m microphones and s speakers, requiring, in general between 2(m+s) to m+s+1 separate connections through the headset electrical interface. Finally, although the microphone preamplifier block in FIG. 2A is shown as being implemented with three op amps, other circuit designs are possible including those that have more than three op amps (for additional performance) and those with less than three op amps (for reduced cost). The description is thus to be regarded as illustrative instead of limiting.

What is claimed is:

1. An audio host device comprising:
an electrical interface having a speaker contact, a microphone contact, and a reference contact, the reference contact to be shared by a microphone and a speaker, the reference contact being directly coupled to a power return plane of the audio host device;
a speaker amplifier having an output that is coupled to the speaker contact; and
a difference amplifier having a first cold input, a second cold input, and a hot input, the first cold input is coupled to an output of the speaker amplifier, the second cold input being coupled to a sense point for the reference contact, and the hot input being coupled to the microphone contact.

2. The audio host device of claim 1 further comprising:
a first variable gain component amplifier coupled between the output of the speaker amplifier and the first cold input; and
a second variable gain component amplifier coupled between the reference sense point and the second cold input.

3. The audio host device of claim 2 further comprising:
a controller coupled to the first and second component amplifiers, wherein the controller is to set the gains of the first and second component amplifiers based on a plurality of different types of microphone circuits that can be coupled to the electrical interface.

4. The audio host device of claim 3 wherein the controller is to automatically detect the type of microphone circuit that is coupled to the interface and on that basis set the gain of one or both of the first and second component amplifiers.

5. The audio host device of claim 3 wherein the controller is to receive user input regarding the type of microphone circuit to be coupled to the interface and on that basis set the gain of one or both of the first and second component amplifiers.

6. The audio host device of claim 1 wherein the difference amplifier comprises an operational amplifier having a non-inverting input, an inverting input, and an output,
wherein the non-inverting input is coupled to a dc bias and to the first and second cold inputs of the difference amplifier, and the inverting input is coupled to receive feedback from the output.

7. The audio host device of claim 3 wherein the difference amplifier comprises an operational amplifier having a non-inverting input, an inverting input, and an output,
wherein the non-inverting input is coupled to a dc bias and to the first and second cold inputs of the difference amplifier, and the inverting input is coupled to receive feedback from the output.

8. The audio host device of claim 7 further comprising
a variable voltage divider circuit coupled between the dc bias and the non-inverting input of the operational amplifier,
wherein the controller is further coupled to set the variable voltage divider circuit to adjust common mode rejection of the difference amplifier based on the plurality of different types of microphone circuits that can be coupled to the interface.

9. The audio host device of claim 3 wherein the difference amplifier has a variable gain and the controller has a further output that is coupled to set the gain of the difference amplifier.

10. The audio host device of claim 1 further comprising:
first and second DC blocking capacitors, the first coupled between the second cold input of the difference amplifier and the reference sense point, the second coupled between the hot input of the difference amplifier and the microphone contact.

11. The audio host device of claim 10 further comprising:
a DC bias circuit coupled to set a voltage on the microphone contact.

12. The audio host device of claim 2 further comprising:
a controller coupled to set the gain of the first and second component amplifiers; and
a test signal generator having an output coupled to the speaker contact, wherein the controller is further coupled to control the test signal generator and is to signal the generator to produce a test signal through the speaker contact while changing gain of one or both of the first and second component amplifiers.

13. The audio host device of claim 12 wherein the difference amplifier comprises an operational amplifier having a non-inverting input, an inverting input, and an output,
wherein the non-inverting input is coupled to a dc bias and to the first and second cold inputs of the difference amplifier, and the inverting input is coupled to receive feedback from the output,
the audio host device further comprising a variable voltage divider circuit coupled between the dc bias and the non-inverting input of the operational amplifier,
wherein the controller is further coupled to set the variable voltage divider circuit to adjust common mode rejection of the difference amplifier while the generator produces the test signal through the speaker contact.

14. The audio host device of claim 12 further comprising:
a mixer having an output coupled to an input of a digital to analog converter, DAC, the DAC having an output coupled to an input of the speaker amplifier,
wherein the mixer has an input coupled to an output of the test signal generator and another input to receive a downlink communications audio signal.

15. A method for operating an audio host device having a headset electrical interface, comprising:
sensing an output of a speaker amplifier, wherein the output is coupled to a speaker contact of the headset electrical interface;
sensing a reference contact of the headset electrical interface, wherein the reference contact is shared by a speaker and a microphone of a microphone-speaker combination that are coupled to the headset electrical interface;
combining the sensed speaker amplifier output and the sensed reference at a cold side input of a difference amplifier;
sensing a microphone contact of the headset electrical interface at a hot side input of the difference amplifier; and
adjusting a proportion of one or both of the sensed speaker amplifier output and the sensed reference, that have been combined at the cold side input.

16. The method of claim 15 further comprising:
detecting the type of microphone circuit that is coupled to the headset electrical interface, and on that basis adjusting the proportion of the sensed speaker amplifier output or the sensed reference.

17. The method of claim 15 further comprising:
playing a super-audible tone through the speaker contact, while the speaker-microphone combination is coupled to the interface; and
measuring output of the difference amplifier, while the speaker-microphone combination is coupled to the interface and the super-audible tone is playing, and on that basis adjusting the proportion of the sensed speaker amplifier output or the sensed reference by an amount that reduces presence of the super-audible tone at the output of the difference amplifier.

18. The method of claim 15 further comprising:
transmitting an uplink audio communications signal from an output of the difference amplifier after having adjusted the proportion of the sensed speaker amplifier output or the sensed reference proportion.

19. The method of claim 15 further comprising:
setting a gain of the difference amplifier, wherein the difference amplifier has variable gain.

20. The method of claim 15 further comprising:
measuring a property of an echo signal from an output of the difference amplifier, wherein the echo signal contains the voice of a far end user that also appears at the output of the speaker amplifier, and on that basis adjusting the proportion of said one or both of the sensed speaker amplifier output and the sensed reference to reduce noise at the output of the difference amplifier.

21. The method of claim 20 wherein the measured property of the echo signal comprises an autocorrelation function applied to the output of the difference amplifier.

22. The method of claim 20 wherein the echo signal contains a constant power test signal that also appears at the output of the speaker amplifier.

23. A portable audio host device comprising:
a host connector having a speaker contact, a microphone contact, and a reference contact, the reference contact to be shared by a microphone and a speaker, the reference contact being directly coupled to a power return plane of the audio host device;
a speaker amplifier having an output that is coupled to the speaker contact of the connector;
a first variable gain component amplifier having an input coupled to the output of the speaker amplifier;

a second variable gain component amplifier having an input coupled to a sense point for the reference contact;

a difference amplifier having a cold side input coupled to an output of the first component amplifier and an output of the second component amplifier, and a hot side input being coupled to the microphone contact; and a controller coupled to the first and second component amplifiers, wherein the controller is to set the gain of the first and second component amplifiers to reduce noise at an output of the difference amplifier.

24. The portable audio host device of claim 23 wherein the reference contact is coupled to a main logic board ground of the host device through a wire path that includes a flexible wire circuit, a spring contact and a board to board connector, and wherein the reference sense point is located on the wire path between the spring contact and the board to board connector.

25. The portable audio host device of claim 23 wherein the controller is to set the gain based upon a type of microphone circuit that is coupled to the host connector.

26. The portable audio host device of claim 25 wherein the controller is to automatically detect the type of microphone circuit that is coupled to the host connector and on that basis set the gain.

27. The portable audio host device of claim 25 wherein the controller is to receive user input regarding the type of microphone circuit to be coupled to the host connector and on that basis set the gain.

28. The portable audio device of claim 23 further comprising a mixer having a first input to receive a downlink audio communications signal, a second input to receive a sidetone signal from an output of the difference amplifier, and an output coupled to an input of the speaker amplifier.

29. The portable audio device of claim 28 further comprising a super-audible tone generator coupled to be controlled by the controller, wherein the mixer has a third input coupled to an output of the tone generator.

* * * * *